(12) United States Patent
Waki et al.

(10) Patent No.: US 6,716,675 B2
(45) Date of Patent: Apr. 6, 2004

(54) SEMICONDUCTOR DEVICE, METHOD OF MANUFACTURING SEMICONDUCTOR DEVICE, LEAD FRAME, METHOD OF MANUFACTURING LEAD FRAME, AND METHOD OF MANUFACTURING SEMICONDUCTOR DEVICE WITH LEAD FRAME

(75) Inventors: Masaki Waki, Satsuma (JP); Fumitoshi Fujisaki, Satsuma (JP); Masao Takehiro, Satsuma (JP); Shinichiro Maki, Satsuma (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 10/226,319

(22) Filed: Aug. 23, 2002

(65) Prior Publication Data

US 2003/0006501 A1 Jan. 9, 2003

Related U.S. Application Data

(63) Continuation of application No. PCT/JP00/01433, filed on Mar. 9, 2000.

(51) Int. Cl.[7] .......................... H01L 21/44; H01L 21/48; H01L 21/50
(52) U.S. Cl. ....................................... 438/122; 438/502
(58) Field of Search ................................. 438/114, 122, 438/123, 462, 463, 465, 464, 502

(56) References Cited

U.S. PATENT DOCUMENTS

| 5,565,709 A | * | 10/1996 | Fukushima et al. |
| 5,889,654 A | * | 3/1999 | Pierson et al. |
| 6,008,537 A | * | 12/1999 | Kosaki et al. |

FOREIGN PATENT DOCUMENTS

| EP | 0 773 584 | 5/1997 |
| JP | 9-162348 | 6/1997 |
| JP | 11-195742 | 7/1999 |

* cited by examiner

Primary Examiner—Phuc T. Dang
(74) Attorney, Agent, or Firm—Westerman, Hattori Daniels & Adrian, LLP

(57) ABSTRACT

The present invention relates to a leadless surface-mount resin-sealing semiconductor device and a manufacturing method thereof; in a semiconductor device comprising a semiconductor element, a resin package sealing this semiconductor element, a terminal formed on a mount side of this resin package so as to protrude thereon, and a wire electrically connecting this terminal and an electrode pad on the semiconductor element to each other, a heat sink dissipating heat generated in the semiconductor element is provided on an undersurface of the semiconductor element so as to improve a heat-dissipation property.

11 Claims, 11 Drawing Sheets

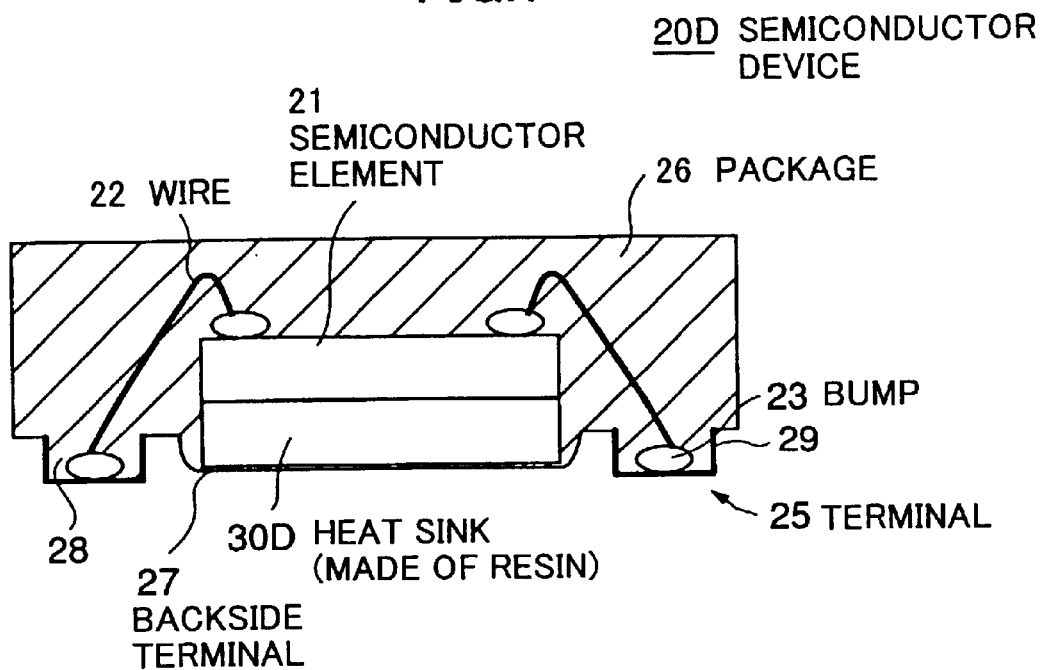
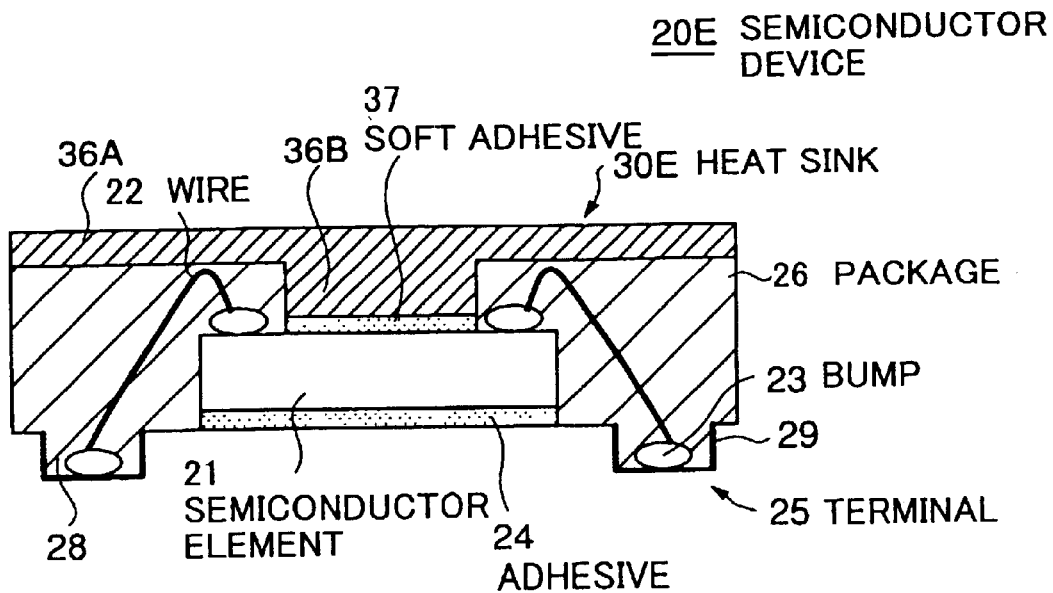

31B LEAD FRAME

31C LEAD FRAME

SEMICONDUCTOR DEVICE, METHOD OF MANUFACTURING SEMICONDUCTOR DEVICE, LEAD FRAME, METHOD OF MANUFACTURING LEAD FRAME, AND METHOD OF MANUFACTURING SEMICONDUCTOR DEVICE WITH LEAD FRAME

This application is a continuation of international application PCT/JP00/01433 filed on Mar. 9, 2000.

TECHNICAL FIELD

The present invention relates to a semiconductor device, a manufacturing method thereof, a lead frame, a manufacturing method thereof, and a manufacturing method of a semiconductor device using a lead frame, and more particularly, to a leadless surface-mount resin-sealing semiconductor device, a manufacturing method thereof, a lead frame, a manufacturing method thereof, and a manufacturing method of a semiconductor device using a lead frame.

Recently, as electronic apparatuses become smaller and highly functional, semiconductor devices provided in these electronic apparatuses also become smaller and thinner at a rapid pace. When semiconductor devices become smaller and thinner, it becomes difficult to efficiently dissipate heat generated in a semiconductor element.

Thus, a new structure to efficiently dissipate heat generated in a semiconductor element is desired even for semiconductor devices made smaller and thinner.

BACKGROUND ART

FIG. 1 and FIG. 2 show conventional semiconductor devices 10A and 10B.

Each of the semiconductor devices 10A and 10B shown in the respective figures has a considerably simple structure comprising a semiconductor element 11, a wire 12, a terminal 15, a resin package 16 and so forth. A resin projection 18 protruding downward from a mount surface 16a of the resin package 16 is formed unitarily with each of the semiconductor devices 10A and 10B The resin projection 18 is coated with a metal film 19 so as to form the terminal 15.

Additionally, in the semiconductor device 10B shown in FIG. 2, a backside terminal 17 is formed on the mount surface 16a of the resin package 16. This backside terminal 17 is a conductive metal film as is the metal film 19, and is so structured as to be electrically connected to a ground terminal on a mounting substrate (not shown in the figures) upon mounting the semiconductor device 10B on the mounting substrate. Accordingly, in the mounting state, the backside terminal 17 functions as a shield member shielding the semiconductor element 11 so as to improve electric characteristics of the semiconductor device 10B.

Since the semiconductor devices 10A and 10B structured as above are not provided with an inner lead and an outer lead as in an SSOP, an area for drawing around from the inner lead to the outer lead and an area of the outer lead per se become unnecessary so as to miniaturize the semiconductor devices 10A and 10B.

Additionally, a loading substrate (an interposer) for forming a solder ball, such as a BGA (Ball Grid Array), also becomes unnecessary so as to reduce costs of the semiconductor devices 10A and 10B. Further, the terminal 15 composed of the resin projection 18 and the metal film 19 exhibits a function equivalent to a solder ball in co-operation so as to obtain a mounting property similar to a semiconductor device of a BGA type.

By the way, as the semiconductor element 11 becomes highly dense recently, an amount of heat generated in the semiconductor element 11 tends to increase. However, since a coefficient of thermal conductivity of resin is low in a resin-sealing semiconductor device, a heat-dissipation characteristic becomes inferior.

Additionally, since the terminal 15 is structured by coating the resin projection 18 with the metal film 19 in the semiconductor devices 10A and 10B shown in FIG. 1 and FIG. 2, an amount of heat dissipation from a mounting terminal is as small as a BGA having a solder ball as a mounting terminal and a QFP (Quad Flat Package) having a lead as a mounting terminal. Therefore, although the semiconductor devices 10A and 10B shown in FIG. 1 and FIG. 2 have the above-mentioned favorable characteristics, the semiconductor devices 10A and 10B have insufficient heat-dissipation characteristics so as to incur a problem that a malfunction is caused in the semiconductor element 11 by the generated heat.

DISCLOSURE OF INVENTION

It is a general object of the present invention to provide an improved and useful semiconductor device, a manufacturing method thereof, a lead frame, a manufacturing method thereof, and a manufacturing method of a semiconductor device using a lead frame in which the above-mentioned problems are eliminated.

A more specific object of the present invention is to provide a semiconductor device capable of efficiently dissipating heat generated in a semiconductor element, a manufacturing method thereof, a lead frame, a manufacturing method thereof, and a manufacturing method of a semiconductor device using a lead frame.

In order to achieve this object, the present invention, which is a semiconductor device comprising a semiconductor element, a resin package sealing the foregoing semiconductor element, a plurality of resin projections formed on a mount side of the foregoing resin package so as to protrude thereon, a metal film provided on the foregoing resin projection, and a wire electrically connecting an electrode pad on the foregoing semiconductor element and the foregoing metal film to each other, is characterized in that a heat-dissipation member is provided opposite the foregoing semiconductor element so as to dissipate heat generated from the foregoing semiconductor element, and a projection amount of the foregoing heat-dissipation member from the foregoing mount surface is arranged to be equal to or smaller than a projection amount of the foregoing resin projection including the foregoing metal film.

According to the present invention, the heat-dissipation member dissipating heat generated from the semiconductor element is provided opposite the semiconductor element such that the heat generated in the semiconductor element is dissipated at the heat-dissipation member. Therefore, the semiconductor element can be cooled efficiently so as to prevent a malfunction from occurring in the semiconductor element.

Additionally, since the projection amount of the heat-dissipation member from the mount surface is arranged to be equal to or smaller than the projection amount of the resin projection including the metal film, the heat-dissipation member does not thwart a joining of the metal film and a mounting substrate upon mounting the semiconductor device.

Additionally, in the above-mentioned semiconductor device, the present invention is characterized in that the foregoing heat-dissipation member is a metal plate formed of a lead-frame material.

According to the present invention, the heat-dissipation member is provided as the metal plate formed of the lead-frame material so as to obtain an excellent heat-dissipation characteristic because the lead-frame material has a high coefficient of thermal conductivity.

Additionally, in the above-mentioned semiconductor device, the present invention is characterized in that at least one metal layer is provided between the foregoing semiconductor element and the foregoing heat-dissipation member, and the foregoing heat-dissipation member is fixed to the foregoing metal layer by bonding.

According to the present invention, at least one metal layer is provided between the semiconductor element and the heat-dissipation member, and the heat-dissipation member is fixed to the metal layer by bonding so that a material having an excellent adhesiveness can be used as the metal layer so as to fix the heat-dissipation member firmly. In addition, since the metal layer per se has a thermal conductivity, the heat generated in the semiconductor element can be efficiently transferred by thermal conduction to the heat-dissipation member.

Additionally, in order to achieve the above-mentioned object, the present invention, which is a semiconductor device comprising a semiconductor element, a resin package sealing this semiconductor element, a plurality of resin projections formed in a peripheral form on a mount side of this resin package so as to protrude thereon, a metal film provided on this resin projection, a backside terminal formed inside positions on the foregoing mount side at which the foregoing resin projections are provided so as to protrude thereat, a wire electrically connecting an electrode pad on the foregoing semiconductor element and the foregoing metal film to each other, is characterized in that a heat-dissipation member is provided between the foregoing semiconductor element and the foregoing backside terminal.

According to the present invention, the heat-dissipation member is provided between the semiconductor element and the backside terminal so that the heat generated in the semiconductor element is first transferred by thermal conduction to the heat-dissipation member, and thereafter is transferred by thermal conduction to the backside terminal so as to be emitted to outside. In this course, since the backside terminal is joined to the mounting substrate on which the semiconductor element is mounted, the heat generated in the semiconductor element is transferred by thermal conduction to the mounting substrate, and is dissipated also at this mounting substrate. Thus, providing the heat-dissipation member between the semiconductor element and the backside terminal enables an increase in a heat-dissipation capacity so as to perform an efficient heat-dissipation process.

Additionally, in the above-mentioned semiconductor device, the present invention is characterized in that the foregoing semiconductor element is placed on the foregoing heat-dissipation member.

According to the present invention, the semiconductor element is placed directly on top of the heat-dissipation member so that the heat generated in the semiconductor element can be directly dissipated to the heat-dissipation member so as to improve a heat-dissipation efficiency. Also, the heat-dissipation member can be used as a substrate on which the semiconductor element is mounted.

Additionally, in order to achieve the above-mentioned object, the present invention, which is a manufacturing method of the above-mentioned semiconductor device, is characterized by comprising a lead frame forming step of forming a lead frame by preparing a substrate formed of the lead-frame material, forming a receding portion at a position in the foregoing substrate corresponding to a position at which the foregoing resin projection is formed, and coating inside of the foregoing receding portion with the foregoing metal film, an element mounting step of mounting the foregoing semiconductor element on the foregoing lead frame, and electrically connecting the foregoing semiconductor element ad the foregoing metal film to each other by the foregoing wire, a sealing step of forming the foregoing resin package sealing at least the foregoing semiconductor element and the foregoing wire, a first lead frame removing step of removing the foregoing lead frame so that a thickness of the foregoing lead frame becomes equal to or smaller than a height of the foregoing resin projection including the foregoing metal film from the foregoing mount surface, and a second lead frame removing step of providing a resist material at a predetermined position on the foregoing lead frame at which to form the foregoing heat-dissipation member, and thereafter, removing the foregoing lead frame on which the foregoing resist is not provided so as to form the foregoing heat-dissipation member.

In the present invention, the lead frame formed in the lead frame forming step is removed after the element mounting step and the sealing step are finished. In this course, firstly, the first lead frame removing step is performed so as to perform a removing process of the lead frame such that the thickness of the lead frame becomes equal to or smaller than the height of the resin projection including the metal film from the mount surface. At the point of completion of this removing process, the metal film shares substantially the same plane as the lead frame, or protrudes slightly from the lead frame.

Next, the second lead frame removing step is performed so as to provide the resist material at the predetermined position on the lead frame at which to form the heat-dissipation member, and thereafter, remove the lead frame on which this resist is not provided. Thereby, the position on the lead frame at which the resist material is provided remains on the mount surface so that this portion becomes the heat-dissipation member.

Thus, utilizing the lead frame used upon manufacturing the semiconductor device, a part of the lead frame is caused to remain, in the first and second lead frame removing steps, so that the part becomes the heat-dissipation member; therefore, manufacturing steps can be simplified, compared to a method of forming a heat-dissipation member from a material different from the lead frame. In addition, a new manufacturing facility for forming the heat-dissipation member is also unnecessary so that facility costs do not increase.

Additionally, in order to achieve the above-mentioned object, the present invention, which is a lead frame used upon manufacturing a semiconductor device comprising a semiconductor device, a resin package sealing the foregoing semiconductor device, a resin projection formed on a mount surface of the foregoing resin package so as to protrude thereon, a metal film provided on the foregoing resin projection, and connecting means for electrically connecting an electrode pad on the foregoing semiconductor element and the foregoing metal film to each other, is characterized in that a receding portion formed at a position in a base corresponding to a position at which the foregoing resin projection is formed, the receding portion having the foregoing metal film formed therein, is formed at both surfaces of the foregoing base.

Additionally, in the above-mentioned lead frame, the present invention is characterized in that the foregoing metal film is a four-layer structured film of a solder layer, a nickel (Ni) layer, a palladium (Pd) layer, and a gold (Au) layer, from an inner layer, or a four-layer structured film of a palladium (Pd) layer, a nickel (Ni) layer, a palladium (Pd) layer, and a gold (Au) layer, from the inner layer.

Additionally, in the above-mentioned lead frame, the present invention is characterized in that the foregoing base is composed of first and second half bases at one surface of each of which the foregoing receding portion is formed, and surfaces of the foregoing first and second half bases at which the foregoing receding portion is not formed are joined to each other.

Additionally, in order to achieve the above-mentioned object, the present invention, which is a manufacturing method of the above-mentioned lead frame, is characterized by comprising a resist applying step of applying etching resists on both surfaces of the base, a resist pattern forming step of forming predetermined resist patterns by removing portions of the foregoing etching resists corresponding to the foregoing receding-portion forming positions, an etching step of forming the receding portions at the foregoing receding-portion forming positions at both surfaces of the foregoing base by using the resist patterns as masks, a metal-film forming step of forming the foregoing metal films in the receding portions formed in the foregoing etching step, and a resist removing step of removing the foregoing etching resists.

Further, in order to achieve the above-mentioned object, the present invention, which is a manufacturing method of a semiconductor device by using the above-mentioned lead frame, is characterized by comprising an element mounting step of mounting the semiconductor element on the foregoing lead frame, a connecting step of electrically connecting an electrode pad formed on the foregoing semiconductor element and the foregoing metal film formed in the foregoing lead frame to each other, a sealing step of forming a resin on the foregoing lead frame, the resin sealing the foregoing semiconductor device, so as to form the resin package, a dividing step of dividing the foregoing lead frame into the foregoing first half base and the foregoing second half base, and a separating step of separating the foregoing resin package together with the foregoing metal film from the foregoing first and second half bases.

According to the lead frame, the manufacturing method of the lead frame, and the manufacturing method of a semiconductor device by using the lead frame, of each of the above-mentioned inventions, a lead-frame cost required for manufacturing one semiconductor device can be reduced, and thus a manufacturing cost can be reduced. In addition, since a multitude of the semiconductor devices can be formed all at one time, a manufacturing efficiency can be improved.

BRIEF DESCRIPTION OF DRAWINGS

Other objects, features and advantages of the present invention will become more apparent from the following detailed description when read in conjunction with the accompanying drawings.

FIG. 7 is a sectional view of a semiconductor device according to a fourth embodiment of the present invention.

FIG. 8 is a sectional view of a semiconductor device according to a fifth embodiment of the present invention.

BEST MODE FOR CARRYING OUT THE INVENTION

Hereinbelow, a description will be given, with reference to the drawings, of embodiments according to the present invention.

Figure 1:
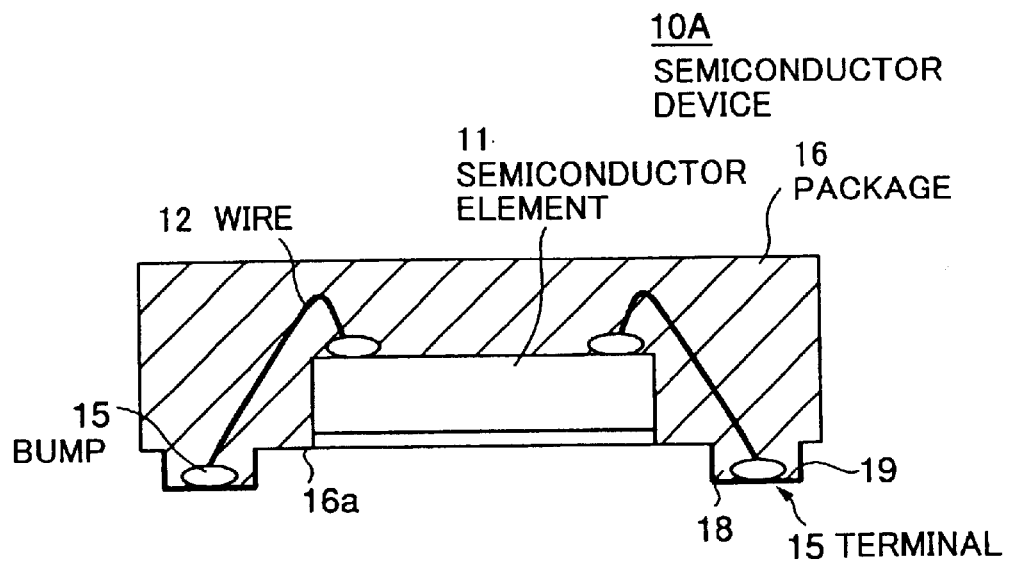
FIG. 1 is a sectional view of a semiconductor device as a conventional example.
Figure 2:
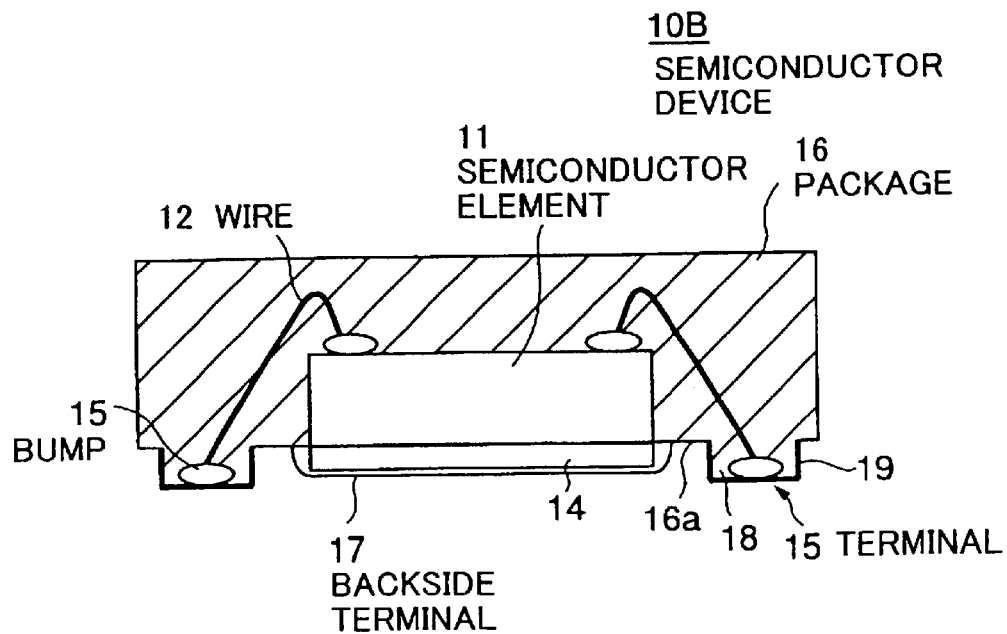
FIG. 2 is a sectional view of a semiconductor device as a conventional example.
Figure 3:
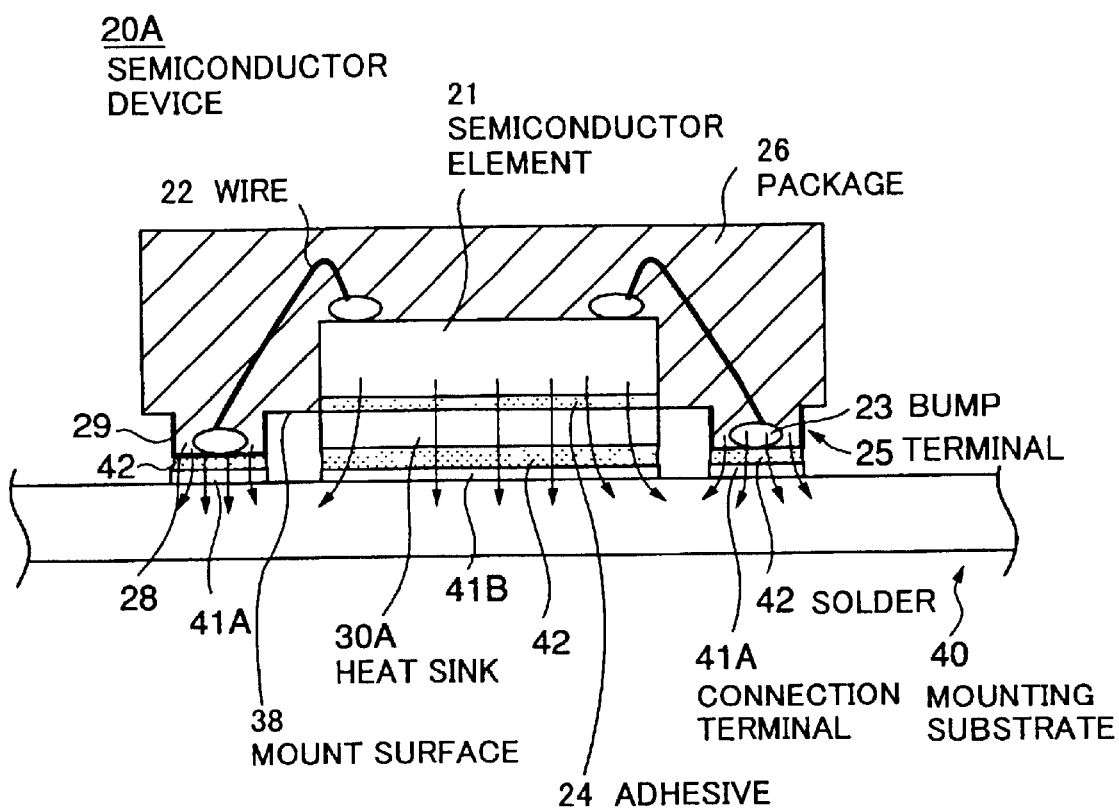
FIG. 3 is a sectional view of a semiconductor device according to a first embodiment of the present invention.

FIG. 3 shows a semiconductor device 20A according to a first embodiment of the present invention. This figure shows a state where the semiconductor device 20A is mounted on a mounting substrate 40. This semiconductor device 20A mainly comprises a semiconductor element 21, a resin package 26 (hereinafter referred to as a package), and a metal film 29.

The semiconductor element 21 is arranged faceup, and a plurality of electrode pads (not shown in the figure) are formed on an upper surface of the semiconductor element 21. Additionally, an adhesive 24 used upon mounting on a hereinafter-described lead frame 31 exists on an under surface of the semiconductor element 21.

The package 26 is formed by transfer-molding (potting is also possible) an epoxy resin, for example, and a resin projection 28 is formed unitarily at a predetermined position on a mount surface 38 of the package 26. This resin projection 28 is so formed as to protrude downward from the mount surface 38 of the package 26.

In addition, the resin projection 28 is provided along an outer periphery of the mount surface 38 so as to be arranged in a so-called peripheral form. Accordingly, the resin projection 28 is not formed at a central part of the mount surface 38. Besides, a pitch of arranging this resin projection 28 can be made approximately 0.8 mm, for example.

The metal film 29 has a structure including a single layer or a lamination of a plurality of conductive films, and is so formed as to cover the resin projection 28 formed on the package 26. A wire 22 is provided between this metal film 29 and the above-mentioned electrode pad of the semiconductor element 21, whereby the metal film 29 and the semiconductor element 21 are electrically connected to each other.

Further, a heat sink 30A (a heat-dissipation member) is provided at a central position on the mount surface 38 so as to oppose the semiconductor element 21. As mentioned above, the resin projection 28 is arranged on the mount surface 38 in a peripheral form, and thus, the resin projection 28 is not formed at the central part of the mount surface 38. The heat sink 30A is provided at this central area on the mount surface 38 at which the resin projection 28 is not formed.

The heat sink 30A is a metal plate, and is formed of a lead-frame material (such as an iron alloy or a copper alloy). This lead-frame material generally has a high coefficient of thermal conductivity; thus, the heat sink 30A exhibits an excellent heat-dissipation characteristic Additionally, a projection amount (a downward projection amount in the figure) of the heat sink 30A from the mount surface 38 is set substantially equal to or slightly smaller than a projection amount of a terminal 25 (a projection amount of the resin projection 28 including the metal film 29) from the mount surface 38.

The semiconductor device 20A structured as above does not require an inner lead and an outer lead as does a conventional SSOP; thus, an area for drawing around from the inner lead to the outer lead and an area of the outer lead per se become unnecessary so as to miniaturize the semiconductor device 20A.

Additionally, a loading substrate does not to be used for forming a solder ball, such as a conventional BGA; thus, a cost of the semiconductor device 20A can be reduced. Further, the resin projection 28 and the metal film 29 cooperatively exhibit a function equivalent to a solder ball of a semiconductor device of a BGA type so as to improve a mounting property.

Subsequently, a description will be given of a heat-dissipation characteristic of the semiconductor device 20A in the state where the semiconductor device 20A is mounted on the mounting substrate 40.

The semiconductor device 20A is mounted on the mounting substrate 40 by using solders 42. Connection terminals 41A and 41B are formed beforehand on the mounting substrate 40. Among these, the connection terminal 41A is formed at a position corresponding to an arrangement position of the terminal 25 formed on the semiconductor device 20A, and the connection terminal 41B is formed at a position opposing the heat sink 30A provided on the semiconductor device 20A.

Thus, after a solder paste is applied on each of the connection terminals 41A and 41B of the mounting substrate 40, the semiconductor device 20A is positioned on the mounting substrate 40 such that the terminal 25 is positioned on the connection terminal 41A, and that the heat sink 30A is positioned on the connection terminal 41B; and the semiconductor device 20A is provisionally attached on the mounting substrate 40. Subsequently, the mounting substrate 40 in a state where the semiconductor device 20A is provisionally attached by the solder paste is caused to flow into a reflow furnace so as to melt the solder, whereby the terminal 25 is joined to the connection terminal 41, and the heat sink 30A is joined to the connection terminal 41B, with the solders 42 therebetween, so that the semiconductor device 20A is mounted on the mounting substrate 40, in the state as shown in FIG. 3.

Besides, upon this mounting, since the projection amount of the heat sink 30A from the mount surface 38 is set equal to or smaller than the projection amount of the terminal 25, the heat sink 30A does not thwart the joining of the terminal 25 (the metal film 29) and the mounting substrate 40 in mounting the semiconductor device 20A.

By the way, as mentioned above, as the semiconductor element 21 becomes highly dense recently, an amount of heat generated in the semiconductor element 21 tends to increase. Additionally, since a coefficient of thermal conductivity of the package 26 sealing the semiconductor element is low, a resin-sealing semiconductor device is likely to have an inferior heat-dissipation characteristic.

However, in the semiconductor device 20A according to the present embodiment, since the heat sink 30A is so arranged as to oppose the semiconductor element 21, the heat generated in the semiconductor element 21 is transferred by thermal conduction via the adhesive 24 to the heat sink 30A, and further is transferred by thermal conduction via the solder 42 and the connection terminal 41B to the mounting substrate 40. In the course of this thermal conduction, the heat generated in the semiconductor element 21 is dissipated to outside. Additionally, the heat generated in the semiconductor element 21 is dissipated also via the terminal 25, although an amount of heat dissipation is small. Arrows shown in FIG. 3 indicate heat-dissipation paths of the heat generated in the semiconductor element 21.

Thus, since the semiconductor device 20A comprises the heat sink 30A, a heat-dissipation area can be widened, compared to a conventional structure in which heat dissipation is performed by the terminal 25 alone. Accordingly, the semiconductor element 21 can be cooled efficiently so as to surely prevent a malfunction from occurring in the semiconductor element 21. Additionally, the lead-frame material having a high coefficient of thermal conductivity is used as the heat sink 30A; also thereby, an excellent heat-dissipation characteristic can be obtained.

Subsequently, a description will be given, with reference to FIG. 4, of a manufacturing method of the semiconductor device 20A according to the above-described first embodiment.

The semiconductor device 20A is manufactured by performing each of a lead frame forming step, an element mounting step, a sealing step, and a lead frame removing step. Additionally, when a plurality of semiconductor devices are formed from one lead frame, a severing step is added to the above-mentioned steps.

Here, the lead frame forming step is a step of forming a lead frame 31A by forming a receding portion 44 at a position corresponding to the position at which the resin projection 28 is formed, and forming a coating of the metal film 29 inside the receding portion 44. The element mounting step is a step of mounting the semiconductor element 21 on the lead frame 31A, and electrically connecting the semiconductor element 21 with the metal film 29 by the wire 22.

The sealing step is a step of forming the package 26 sealing at least the semiconductor element 21 and the wire 22. The lead frame removing step is a step of removing the lead frame 31A so as to make the semiconductor device 20A independent. Further, the severing step is a step of separating a group of the continuous semiconductor devices from which the lead frame is removed into individual semiconductor devices in pieces.

The manufacturing method according to the present embodiment is characterized by the lead frame removing step, among all the above-mentioned steps; in the other steps, the same processes as conventional steps are performed. Accordingly, the following description is given only of the lead frame removing step characterizing the present embodiment.

Figure 4A:
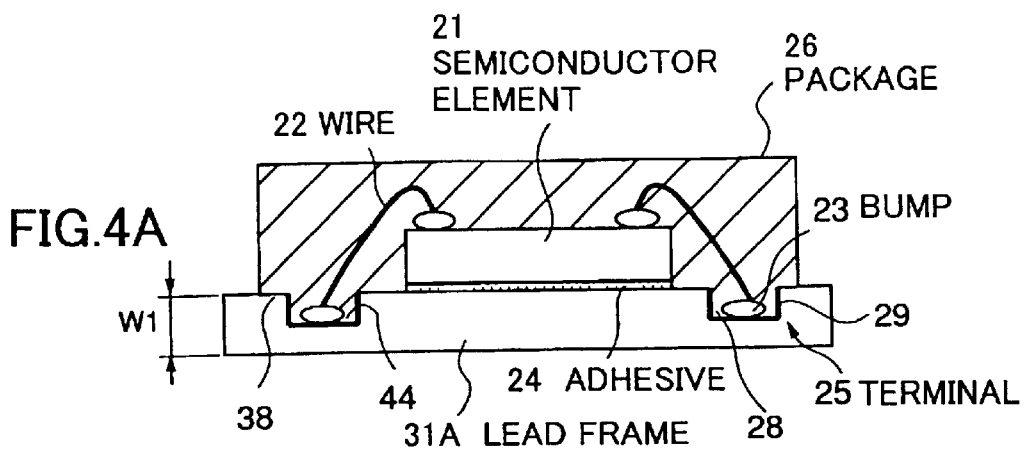
FIG. 4 is an illustration used for explaining a manufacturing method of the semiconductor device according to the first embodiment of the present invention.

FIG. 4A shows a state after the lead frame forming step, the element mounting step, and the sealing step are finished. In this state, the metal film 29 and the resin projection 28 are formed inside each of a plurality of the receding portions 44 formed in the lead frame 31A.

Additionally, the metal film 29 is electrically connected with the semiconductor element 21 by the wire 22, and the resin projection 28 is formed unitarily with the package 26. The semiconductor element 21 is fixed on the lead frame 31A by the adhesive 24. Besides, a thickness W1 of the lead frame 31A (a projection amount from the mount surface 38) at this point is larger than a depth of the receding portion 44, as a matter of course.

In the lead frame removing step, a process of separating the lead frame 31A from the package 26 is performed. Specifically, an etching solution is jetted to the lead frame 31A so as to dissolve the lead frame 31A; thereby, the package 26 is separated from the lead frame 31A. In the present embodiment, this lead frame removing step is realized by performing a first lead frame removing step and a second lead frame removing step.

In the first lead frame removing step, the etching solution is jetted to all surfaces of the lead frame 31A so as to perform such an etching process that the lead frame 31A is etched at a uniform rate throughout. The etching solution used in this etching process is selected for having a property of dissolving only the lead frame 31A but not dissolving the metal film 29.

This first lead frame removing step is performed until the thickness of the lead frame 31A becomes equal to or smaller than a height (a dimension indicated by an arrow W2 in FIG. 4B) of the resin projection 28 including the metal film 29 from the mount surface 38, in other words, until the thickness of the lead frame 31A becomes equal to or smaller than a height of the terminal 25.

Figure 4B:
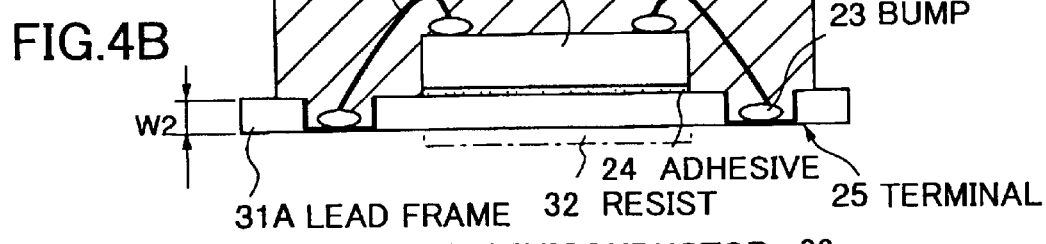

FIG. 4B shows a state after the first lead frame removing step is finished. In this state, the lead frame 31A as a whole has a thickness equaling the above-mentioned W2. Therefore, in this state, a bottom part of the metal film 29 shares substantially the same plane as the lead frame 31A, or protrudes slightly from the lead frame 31A.

After the above-mentioned first lead frame removing step is finished, the second lead frame removing step is performed. In this second lead frame removing step, a resist 22 is provided on the lead frame 31A, first. This resist 22 has an arrangement position so set as to correspond to a position at which the heat sink 30A is formed.

Figure 4C:
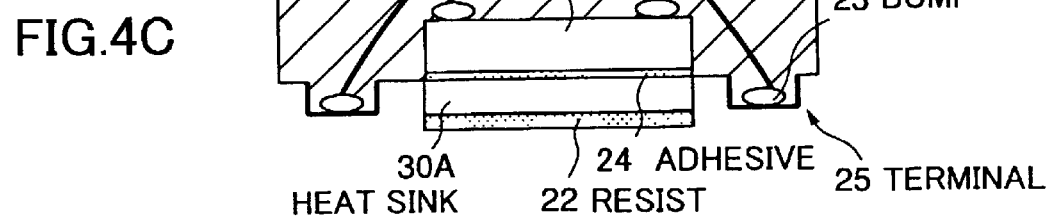
Figure 4D:
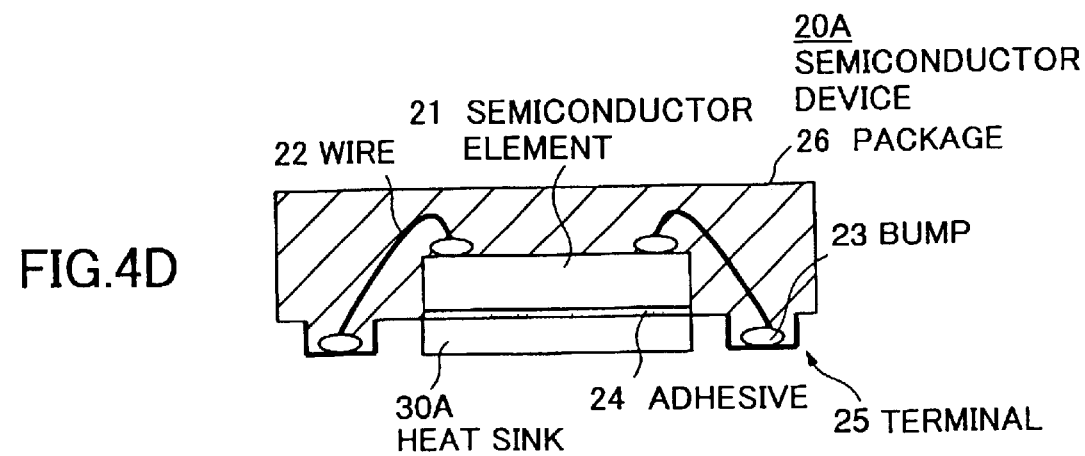

Subsequently, as in the first lead frame removing step, the etching solution is jetted to all surfaces of the lead frame 31A so as to perform an etching process to the lead frame 31A. In this course, a portion of the lead frame 31A on which the resist 32 is formed is not removed even by the etching process, but a portion of the lead frame 31A on which the resist 32 is not formed is selectively etched. Thereby, the heat sink 30A is formed, as shown in FIG. 4C. Then, by removing the resist 32 provided on the heat sink 30A, the semiconductor device 20A is formed, as shown in FIG. 4D.

Thus, in the present embodiment, utilizing the lead frame 31A used upon manufacturing the semiconductor device 20A, a part of the lead frame 31A is caused to remain, in the first and second lead frame removing steps, so that the part becomes the heat sink 30A. Therefore, manufacturing steps can be simplified, compared to a method of forming a heat sink from a material different from the lead frame 31A. Additionally, a new manufacturing facility for forming the heat sink 30A is also unnecessary so as to reduce facility costs. Further, since the present embodiment uses a method in which the lead frame 31A is dissolved so as to separate the package 26 from the lead frame 31A, this separating process can be performed surely and easily so as to increase a yield.

Besides, although the above-described embodiment sets forth the method for removing the lead frame 31A by jetting the etching solution, the method for removing the lead frame 31A is not limited thereto, and other etching methods can be used. Specifically, conceivable etching methods include a method in which the lead frame 31A is soaked in an etching-solution bath filled with an etching solution loaded in an etching bath 31 so as to perform an etching thereby.

Next, a description will be given of a second embodiment according to the present invention.

Figure 5:
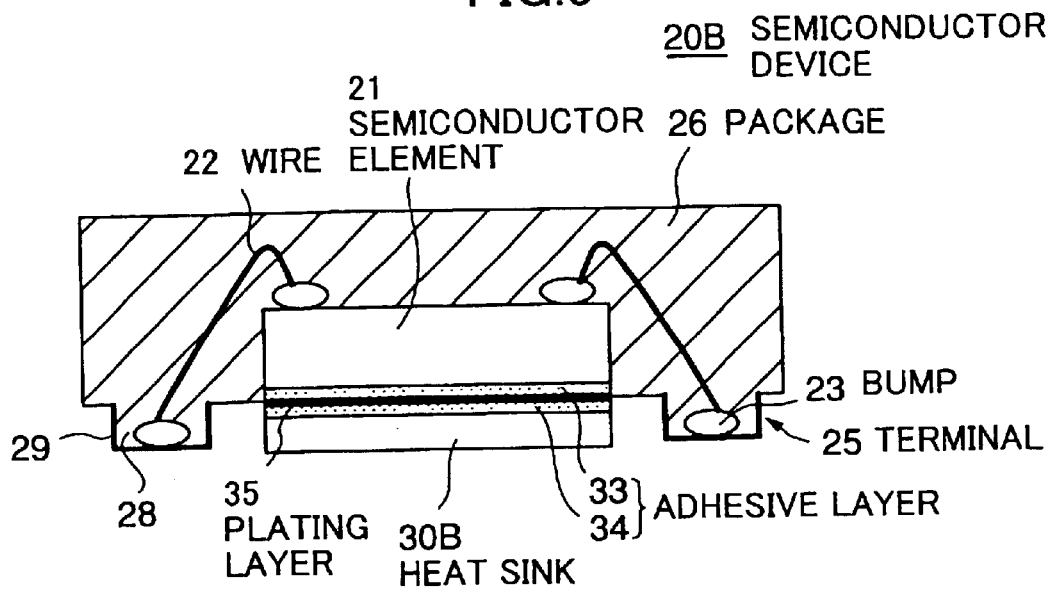
FIG. 5 is a sectional view of a semiconductor device according to a second embodiment of the present invention.

FIG. 5 shows a semiconductor device 20B according to the second embodiment of the present invention. Besides, in FIG. 5, elements that are identical to the elements shown in FIG. 3 and FIG. 4 are referenced by the same reference marks, and descriptions thereof will be omitted. The same applies to FIG. 6 and following figures.

The semiconductor device 20A according to the first embodiment shown in FIG. 3 has a structure in which the heat sink 30A is provided under the semiconductor element 21 with the adhesive 24 therebetween. By contrast, the semiconductor device 20B according to the present embodiment is characterized in that a plating layer 35 (a metal layer) is provided between the semiconductor element 21 and a heat sink 30B. This plating layer 35 is formed by plating on an adhesive layer 33 provided under the semiconductor element 21. The heat sink 30B is bonded to the plating layer 35 with an adhesive layer 34 therebetween.

Thus, by providing a structure in which at least one layer of the plating layer 35 is provided between the semiconductor element 21 and the heat sink 30B such that the heat sink 30B is fixed to the plating layer 35 by bonding, a freedom of selecting the plating layer 35 and the adhesive 34 can be expanded.

Accordingly, by selecting the adhesive 34 as having an excellent adhesiveness to the heat sink 30B, and by selecting the plating layer 35 as having an excellent adhesiveness to the adhesive 34, the heat sink 30B can be fixed firmly on the semiconductor device 20B so as to improve a reliability of the semiconductor device 20B. Additionally, since the plating layer 35 per se is a metal so as to have a high coefficient of thermal conductivity, the heat generated in the semiconductor element 21 can be efficiently transferred by thermal conduction to the heat sink 30B.

Besides, although the present embodiment sets forth the structure in which one layer of the plating layer 35 is provided, the plating layer 35 is not limited to one layer, and a plurality of layers may be formed.

Next, a description will be given of third and fourth embodiments according to the present invention.

Figure 6:
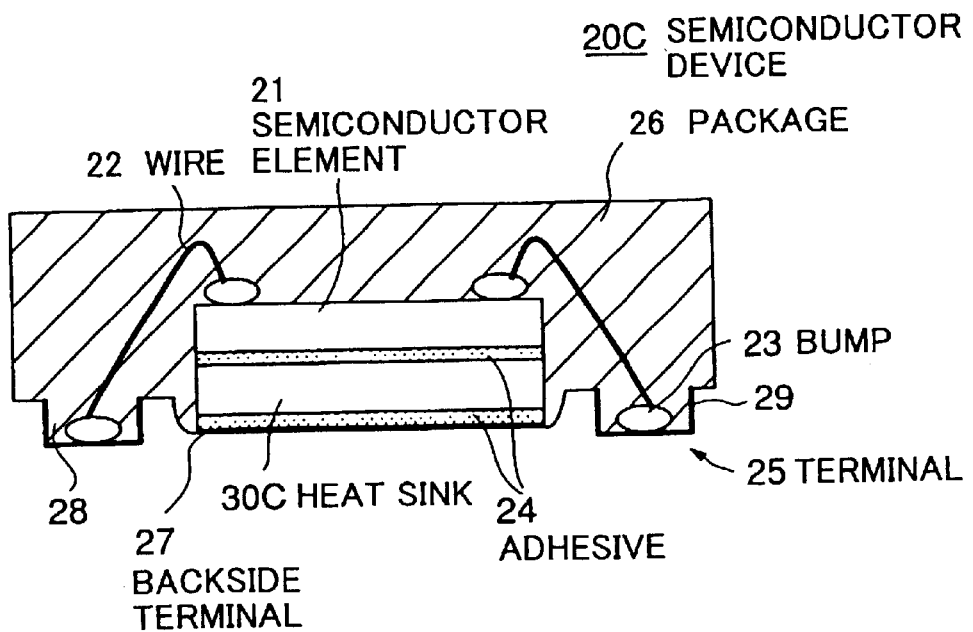
FIG. 6 is a sectional view of a semiconductor device according to a third embodiment of the present invention.

FIG. 6 and FIG. 7 show semiconductor devices 20C and 20D according to the third and fourth embodiments of the present invention. Each of the semiconductor devices 20C and 20D has a structure including a backside terminal 27. This backside terminal 27 is a conductive metal film, and is so structured as to be connected to a grounding electrode pad of the semiconductor element 21 by the wire 22, although not shown in the figures. Additionally, this backside terminal 27 is to be electrically connected to a ground terminal on a mounting substrate (not shown in the figures) upon mounting the semiconductor devices 20C and 20D on the mounting substrate. Accordingly, in the mounting state, the backside terminal 27 is connected to both the grounding electrode pad of the semiconductor element 21 and the ground terminal on the mounting substrate, and thereby functions as a shield member shielding the semiconductor element 21 so as to improve electric characteristics of the semiconductor devices 20C and 20D.

The semiconductor device 20C according to the third embodiment shown in FIG. 6 has a structure in which a heat sink 30C made of metal is provided between the backside terminal 27 and the semiconductor element 21. This heat sink 30C is fixed to the backside terminal 27 by the adhesive 24. The semiconductor element 21 is mounted on top of the heat sink 30C by the adhesive 24.

On the other hand, the semiconductor device 20D according to the fourth embodiment is characterized by using a heat sink 30D made of resin. This heat sink 30D has a structure in which metal powder is mixed in a resin having a high coefficient of thermal conductivity so as to have a high coefficient of thermal conductivity as a whole. Additionally, heating the heat sink 30D made of resin causes the resin to have adhesiveness like an adhesive; therefore, the semiconductor element 21 and the heat sink 30D, and the backside terminal 27 and the heat sink 30D are so structured as to be connected directly to each other by an adhesion force that the heat sink 30D per se yields.

In each of the semiconductor devices 20C and 20D structured as above, since the heat sink 30C or 30D is provided between the semiconductor element 21 and the backside terminal 27, the heat generated in the semiconductor element 21 is first transferred by thermal conduction to the heat sink 30C or 30D, and thereafter is transferred by thermal conduction to the backside terminal 27 so as to be emitted to outside.

In this course, since the backside terminal 27 is joined to the mounting substrate (not shown in the figures) upon mounting, the heat generated in the semiconductor element 21 is dissipated not only from the backside terminal 27 but also from the mounting substrate. Thus, providing the heat sink 30C or 30D between the semiconductor element 21 and the backside terminal 27 enables an increase in a heat-dissipation capacity so as to perform an efficient heat-dissipation process.

Additionally, the semiconductor device 20D according to the fourth embodiment has a structure in which the semiconductor element 21 is placed directly on top of the heat sink 30D so that the heat generated in the semiconductor element 21 can be directly dissipated to the heat sink 30D; thus, a heat-dissipation efficiency can be improved.

Next, a description will be given of a fifth embodiment according to the present invention.

FIG. 8 shows a semiconductor device 20E according to the fifth embodiment of the present invention. The semiconductor device 20E according to the present embodiment is characterized in that a heat sink 30E is provided on top of the semiconductor element 21. The heat sink 30E is made of metal, and is composed of a plate-form portion 36A and a protruding portion 36B.

In the present embodiment, the plate-form portion 36A is so structured as to cover all over an upper surface of the package 26. However, the plate-form portion 36A is not necessarily so structured as to cover all over the upper surface of the package 26, and an area thereof is variable according to an amount of the heat generated in the semiconductor element 21.

The protruding portion 36B is so formed as to protrude from the plate-form portion 36A toward the semiconductor element 21. An end surface of this protruding portion 36B is bonded to the upper surface of the semiconductor element 21 by a soft adhesive 37. At this point, the soft adhesive 37 is used for bonding the protruding portion 36B to the semiconductor element 21 for the purpose of protecting a circuit formed on the upper surface of the semiconductor element 21.

Subsequently, a description will be given of a manufacturing method of a semiconductor device according to a second embodiment of the present invention.

In the manufacturing method of the semiconductor device described with reference to FIG. 4, the semiconductor device 20A is formed by using only one surface of the lead frame 31A. By contrast, in the manufacturing method according to the present embodiment, semiconductor devices are formed on both surfaces of a lead frame so as to improve productivity.

Figure 9:
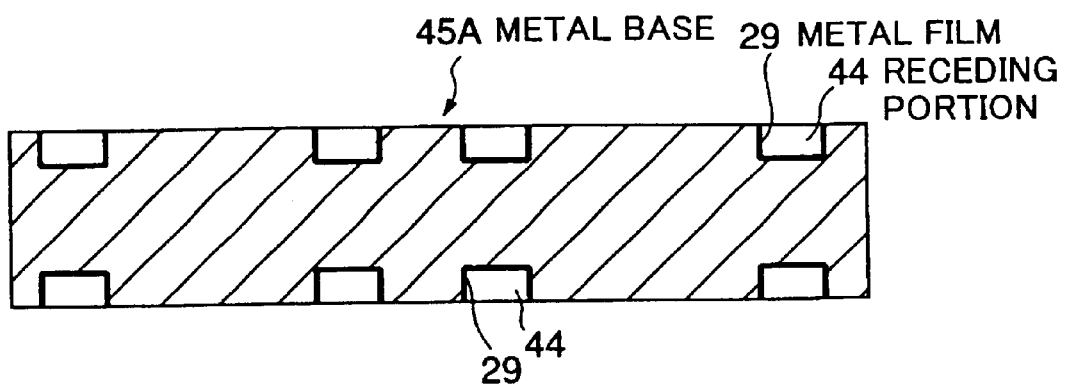
FIG. 9 is an illustration showing a lead frame applicable to a manufacturing method of a semiconductor device according to a second embodiment of the present invention.
Figure 10:
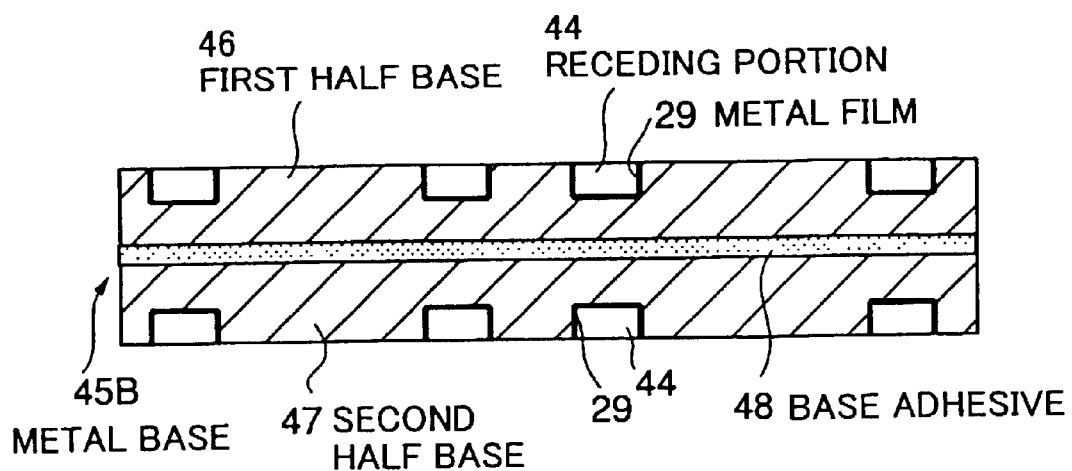
FIG. 10 is an illustration showing a lead frame applicable to a manufacturing method of a semiconductor device according to a second embodiment of the present invention.

FIG. 9 and FIG. 10 show lead frames 31B and 31C used in the manufacturing method according to the present embodiment. In the lead frame 31B, the receding portions 44 are formed at each of an upper surface and an undersurface of one metal base 45A, and the metal film 29 is formed on inner surfaces of each of the receding portions 44. It is arranged that the receding portions 44 are formed at positions corresponding to positions at which the terminals 25 of the semiconductor devices are formed.

In the lead frame 31C, a metal base 45B is composed of first and second half bases 46 and 47. The receding portions 44 are formed at one surface of each of the half bases 46 and 47, and the metal film 29 is formed on the inner surfaces of each of the receding portions 44. Surfaces of the half bases 46 and 47 at which the receding portions 44 are not formed are placed so as to oppose each other, and are joined by a base adhesive 48. Thereby, the first and second half bases 46 and 47 are united so as to compose the lead frame 31C. Besides, a method of joining the first and second half bases 46 and 47 is not limited to a method using the base adhesive 48 as mentioned above; a method of joining the first and second half bases 46 and 47 by performing a rolling processing mechanically may be used, for example.

The lead frames 31B and 31C structured as above are manufactured as follows. It is noted that the following description will be given by taking a manufacturing method of the lead frame 31C as an example.

Figure 11:
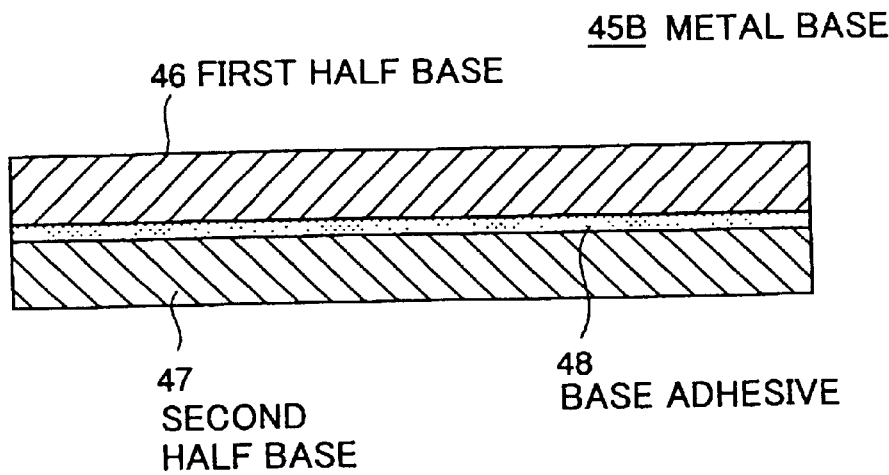
FIG. 11 is an illustration used for explaining one embodiment of a manufacturing method of the lead frame (a step of joining half bases).
Figure 12:
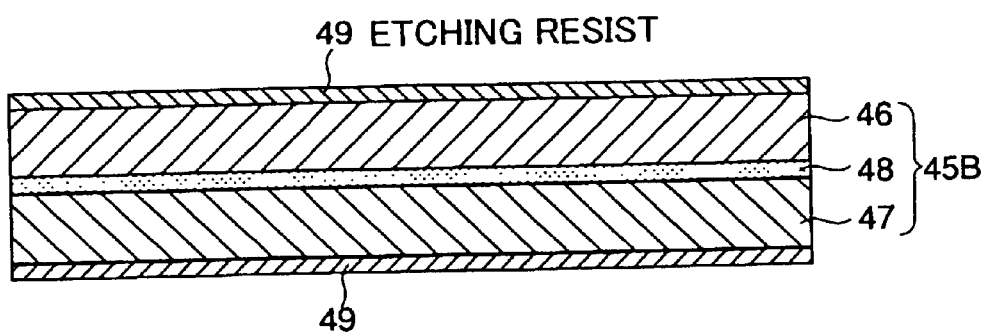
FIG. 12 is an illustration used for explaining the embodiment of the manufacturing method of the lead frame (a resist applying step).

In order to manufacture the lead frame 31C, first, as shown in FIG. 11, the first and second half bases 46 and 48 in the form of flat plates made of conductive materials (e.g., copper) are prepared, and this pair of the half bases 46 and 48 are bonded to each other by the base adhesive 48 so as to form the metal base 45B. Subsequently, as shown in FIG. 12, etching resists 49 are applied on both upper and under surfaces of this metal base 45B (a resist applying step). This etching resist 49 is a photosensitive resin, for example, and is applied by using a spinner, etc. so as to have a predetermined thickness.

Figure 13:
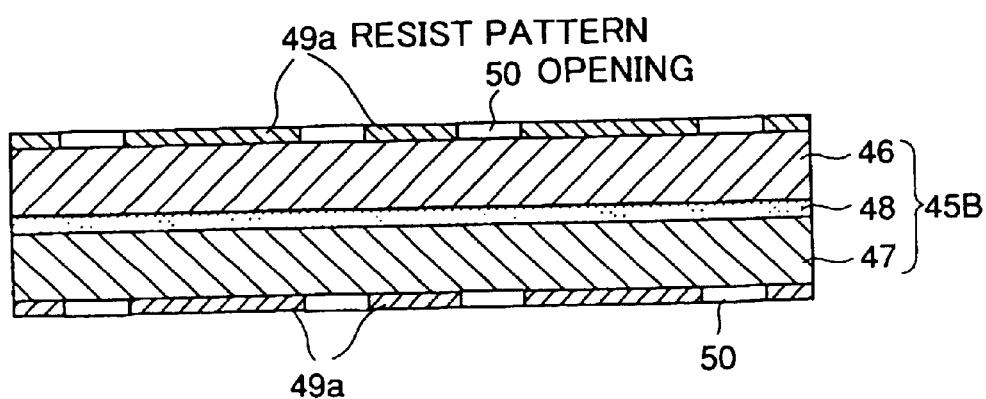
FIG. 13 is an illustration used for explaining the embodiment of the manufacturing method of the lead frame (a resist pattern forming step).

Subsequently, an exposing process is performed to the etching resists 49 by using masks not shown in the figures, and thereafter, a developing process is performed so as to form resist patterns 49a in which openings 50 are formed at the positions at which the terminals 25 are formed later (a resist pattern forming step). FIG. 13 shows the resist patterns 49a in which the openings 50 are formed.

Figure 14:
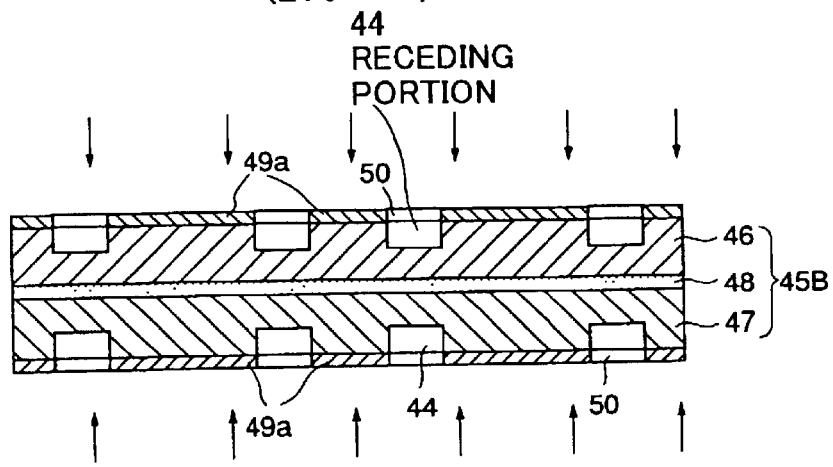
FIG. 14 is an illustration used for explaining the embodiment of the manufacturing method of the lead frame (an etching step).

After the resist pattern forming step is finished, a half etching process is performed to both surfaces of the metal base 45B on which the resist patterns 49a are formed so that the receding portions 44 are formed at both surfaces of the metal base 45B (an etching step). The depth of the receding portion 44 is equivalent to the height of the terminal 25 formed later, and the receding portion 44 is so formed as to be 0.05–010 mm in depth. The depth of this receding portion 44 is caused to be the above-mentioned predetermined depth by controlling an etching time. Besides, when a copper (Cu) is used as a material forming the metal base 45B, a ferric chloride, for example, can be used as an etching solution. FIG. 14 shows the metal base 45B at both surfaces of which the receding portions 44 having the predetermined depth are formed.

When the etching step is performed as described above, a metal-film forming step is subsequently performed so as to form the metal film 29. A plating method, for example, can be used as a method of forming the metal film 29. Additionally, the metal film 29 according to the present embodiment is a four-layer structured film in which a solder layer, a nickel (Ni) layer, a palladium (Pd) layer, and a gold (Au) layer are stacked, from an inner layer. Therefor, each of the layers is plated and stacked in succession so as to form the metal film 29. Besides, a layer structure of the metal film 29 is not limited to the above-mentioned combination, and the metal film 29 may be a four-layer structured film in which a palladium (Pd) layer, a nickel (Ni) layer, a palladium (Pd) layer, and a gold (Au) layer are stacked, from the inner layer.

Figure 15:
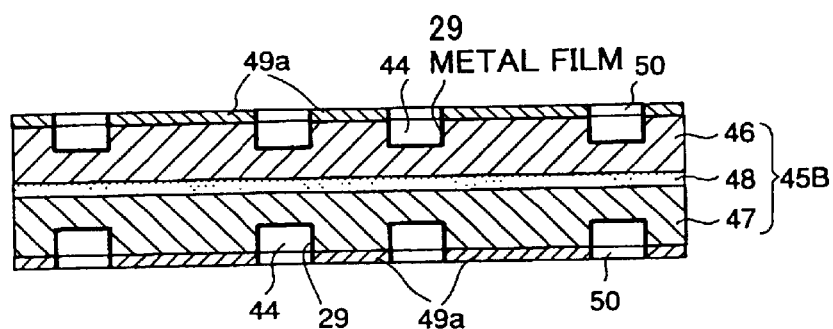
FIG. 15 is an illustration used for explaining the embodiment of the manufacturing method of the lead frame (a metal-film forming step).

By performing the above-described process, the metal film 29 is formed in the metal base 45B by coating, as shown in FIG. 15. However, upon separating the package 26 from each of the half bases 46 and 47 in a separating step as described hereinafter, the metal film 29 also needs to be parted from each of the half bases 46 and 47. Therefor, the metal film 29 is required to have a certain degree of separability with respect to each of the half bases 46 and 47. Accordingly, it may be arranged that, prior to forming the metal film 29 in the receding portion 44, for the purpose of securing the above-mentioned separability, a material improving the separability, such as a conductive paste, is applied in the receding portion 44, upon which the metal film 29 is formed.

Besides, although the method of forming the metal film 29 by using a plating method is described in the above-mentioned metal-film forming step, a formation of the metal film 29 is not limited to the plating method; and the metal film 29 may be formed by using other film-formation techniques, such as a deposition method and a sputtering method, for example.

After the metal film 29 is formed in the receding portion 44 in the metal-film forming step, a resist removing step for removing the resist patterns 49a (the etching resists 49) and a surface smoothing step for the metal base 45B are performed so as to form the lead frame 31C shown in FIG. 10. In the above-described manufacturing method of the lead frame 31C, the lead frame 31C can be formed by using simple steps, such as the resist applying step, the resist pattern forming step, the etching step, the metal-film forming step, and the resist removing step.

Subsequently, a description will be given of the manufacturing method of a semiconductor device by using the lead frame 31C manufactured as described above.

Figure 16:
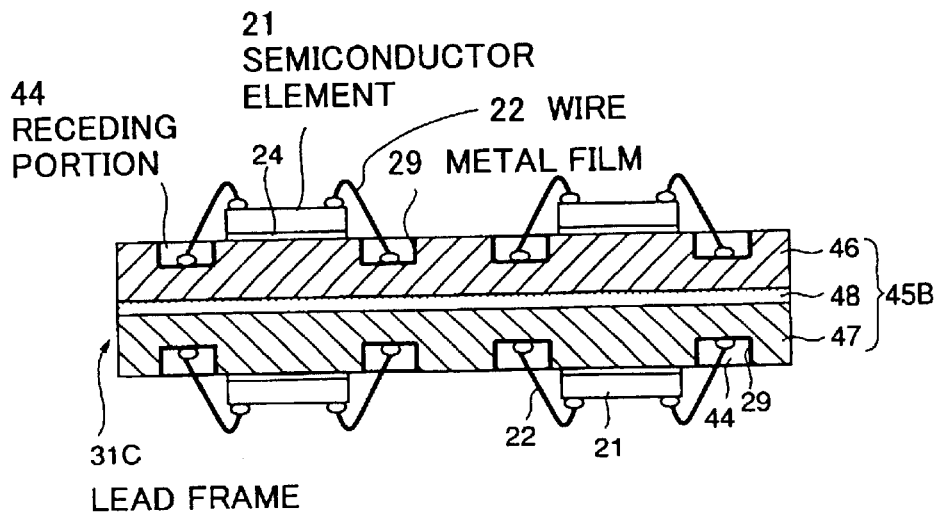
FIG. 16 is an illustration used for explaining the manufacturing method of a semiconductor device according to the second embodiment of the present invention (an element mounting step, a connecting step).

In order to manufacture the semiconductor device, the adhesive 24 is applied at a predetermined element mounting position on the lead frame 31C, and the semiconductor element 21 is mounted on top of this adhesive 24 (an element mounting step). When this element mounting step is finished, the lead frame 31C is mounted on a wire bonding machine, and the wire 22 is provided between the electrode pad formed on the upper surface of the semiconductor element 21 and the metal film 29 formed in the lead frame 31C so as to electrically connect the semiconductor element 21 and the metal film 29 to each other, as shown in FIG. 16 (a connecting step).

Figure 17:
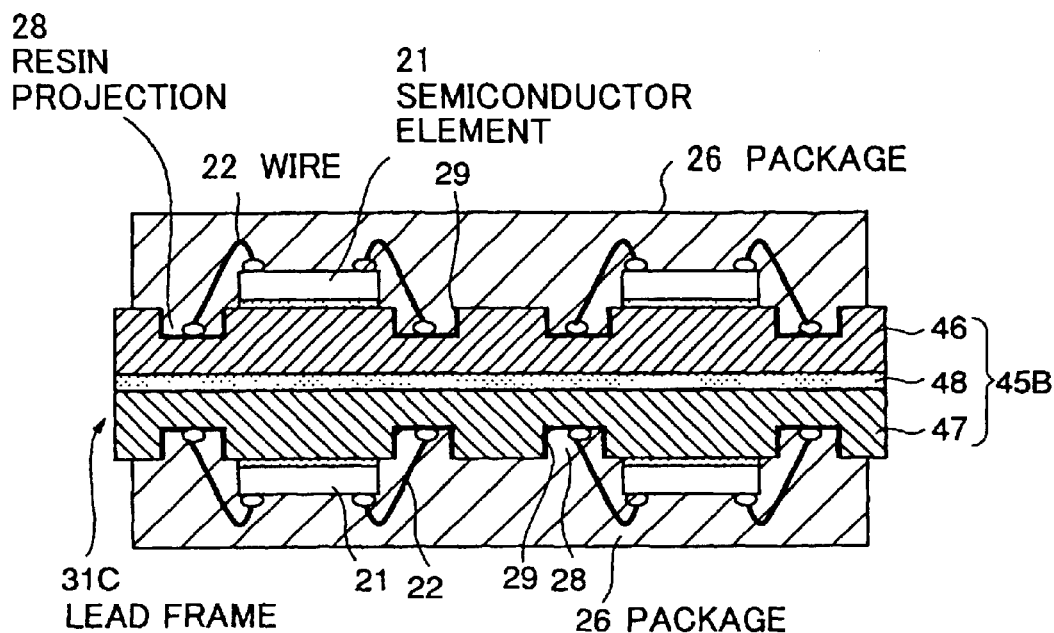
FIG. 17 is an illustration used for explaining the manufacturing method of a semiconductor device according to the second embodiment of the present invention (a sealing step).

After the above-mentioned connecting step is finished, the package 26 sealing a plurality of the semiconductor elements 21 formed on the lead frame 31C is formed (a sealing step). FIG. 17 shows a state where the package 26 is formed. Although FIG. 17 shows an example where the package 26 is formed by transfer-molding, this package 26 can be formed also by other resin forming methods, such as potting. When applying the transfer-molding, the package 26 can be formed at a low cost with high reliability; on the other hand, when applying the potting, a manufacturing facility can be simplified, and a cost thereof can be lowered.

Figure 18:
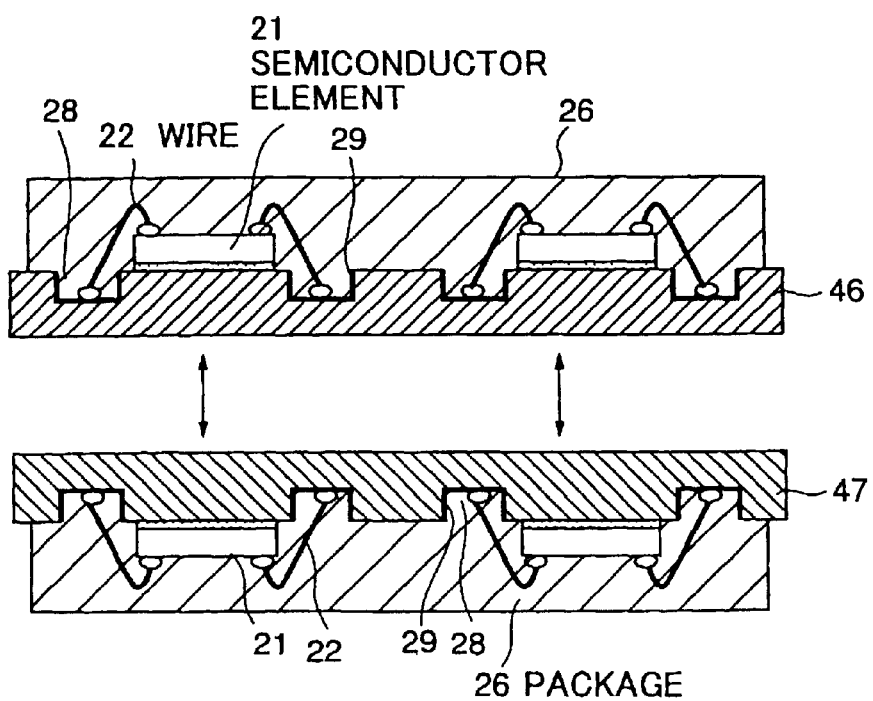
FIG. 18 is an illustration used for explaining the manufacturing method of a semiconductor device according to the second embodiment of the present invention (a dividing step).

After the above-mentioned sealing step is finished, a dividing step for dividing the first half base 46 and the second half base 47 is performed. In this dividing step, the base adhesive 48 is chemically dissolved so as to divide the first and second half bases 46 and 47. Thereby, the first and second half bases 46 and 47 can be dealt with independently. FIG. 18 shows a state where the first and second half bases 46 and 47 are divided.

Besides, a method for dividing the first and second half bases 46 and 47 is not limited to a method of dissolving the base adhesive 48 chemically as described above; for example, a method can be used in which a resin softening by heating (which needs to have a lower softening point than the resin forming the package 26) is used as the base adhesive 48 so that the first and second half bases 46 and 47 divide by performing a heating process.

Figure 19:
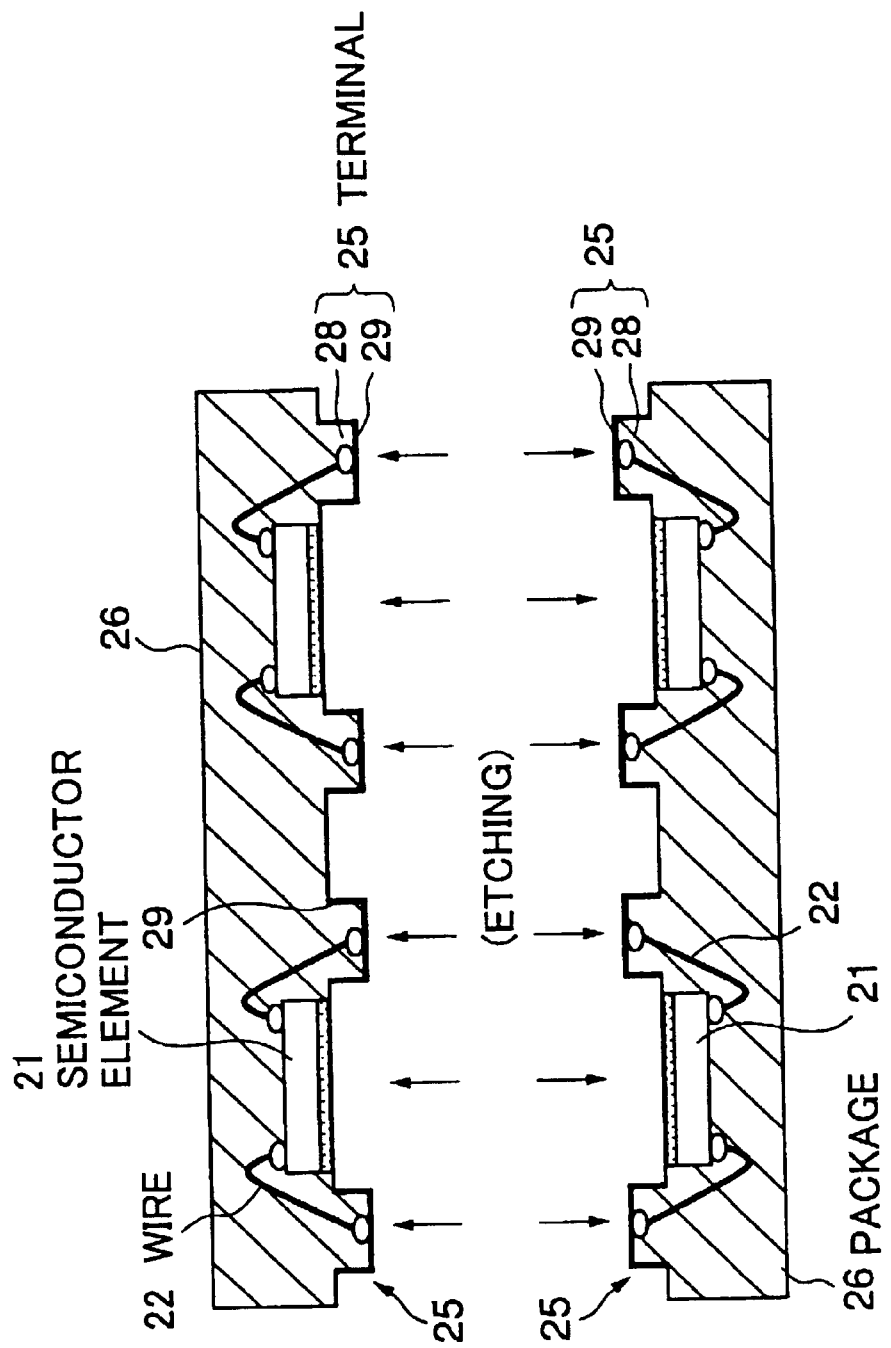
FIG. 19 is an illustration used for explaining the manufacturing method of a semiconductor device according to the second embodiment of the present invention (a separating step).

After the above-mentioned dividing step is finished, the separating step for separating the package 26 from the first and second half bases 46 and 47 is performed. FIG. 19 shows the separating step; an example shown in this figure illustrates a method in which the first and second half bases 46 and 47 are dissolved by jetting an etching solution to divided faces of the first and second half bases 46 and 47 so as to separate the package 26 from the first and second half bases 46 and 47.

The etching solution used in this separating step is selected for having a property of dissolving only the first and second half bases 46 and 47 but not dissolving the metal film 29. Accordingly, the first and second half bases 46 and 47 are completely dissolved so that the package 26 is separated from the first and second half bases 46 and 47.

Thus, by using the method in which the first and second half bases 46 and 47 are dissolved so as to make the package 26 separate and independent, a process of separating the package 26 from the first and second half bases 46 and 47 can be performed surely and easily so as to increase a yield.

Besides, a method for separating the package 26 from the first and second half bases 46 and 47 is not limited to the above-described method of dissolving the first and second half bases 46 and 47; for example, a method can be used in which the package 26 is mechanically separated from the first and second half bases 46 and 47 by peeling the package 26 from the first and second half bases 46 and 47.

In this separating method, the etching solution becomes unnecessary, and a time required for the separating step can be shortened, compared to the method according to the above-mentioned embodiment. However, since the package 26 is mechanically separated from the first and second half bases 46 and 47, there is a point in question whether or not the metal film 29 surely transfers from each of the receding portions 44 to the resin projection 28. However, this point can be solved by forming the metal film 29 after providing a material (an agent) improving the separability of the metal film 29 in the receding portion 44, in the above-described metal-film forming step.

Figure 20:
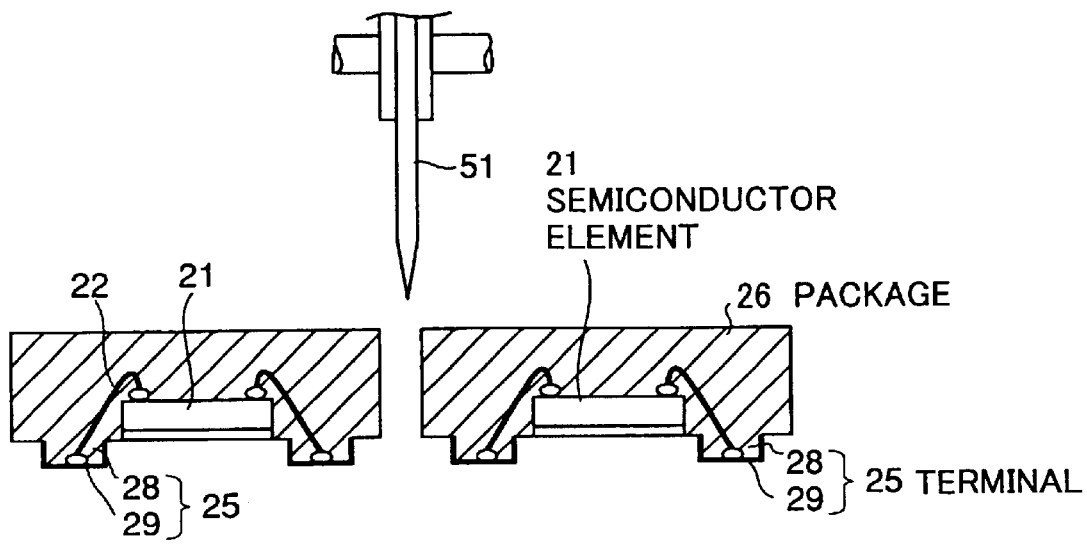
FIG. 20 is an illustration used for explaining the manufacturing method of a semiconductor device according to the second embodiment of the present invention (a severing step).

After the above-mentioned separating step is finished, a severing step is performed. In this severing step, a plurality of the packages 26 in a continuous state are severed into individual packages 26. In the present embodiment, a cutting saw 51 is used as a jig for severing a resin-sealing member 27, as shown in FIG. 20. This cutting saw 51 has the same structure as a dicing saw used in severing a wafer, and enables a highly precise severing process with an extremely narrow severing margin. Besides, other than the cutting saw 51, the separating process can be performed by using a laser light or an electronic beam, for example.

Figure 21:
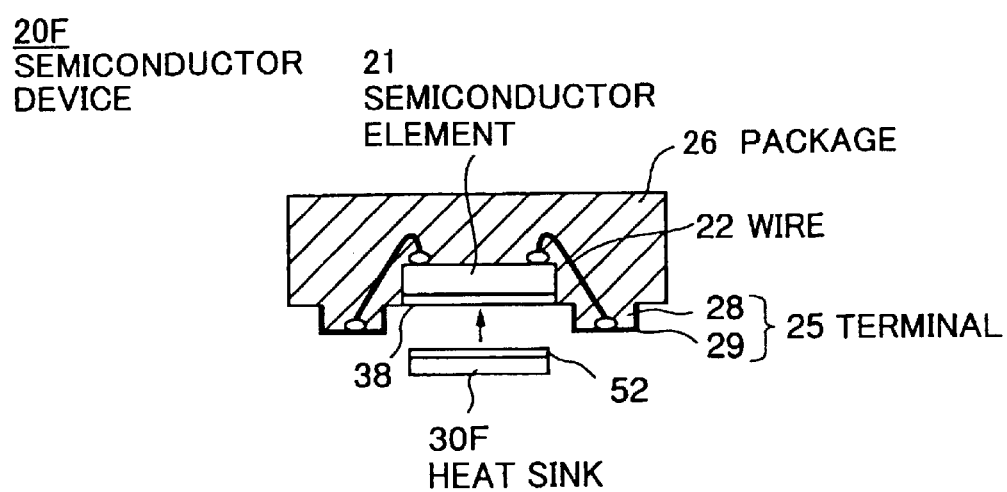
FIG. 21 is an illustration used for explaining the manufacturing method of a semiconductor device according to the second embodiment of the present invention (a step of joining a heat sink).

Subsequently, as shown in FIG. 21, a heat sink 30F is fixed to the mount surface 38 of the package 26 by an adhesive 52 (a heat sink providing step), whereby a semiconductor device 20F is formed. By performing the heretofore-described steps, the semiconductor device 20F is manufactured. According to the above-described manufacturing method, the semiconductor element 21 can be mounted and processed on each of both surfaces of the lead frame 31B or 31C. Therefore, a lead-frame cost required for manufacturing one semiconductor device 20F can be halved, and thus a manufacturing cost can be reduced. Additionally, since a multitude of the semiconductor devices 20F can be formed all at one time, a manufacturing efficiency can be improved.

As described above, according to the present invention, the heat generated in the semiconductor element is dissipated at the heat-dissipation member; therefore, the semiconductor element can be cooled efficiently so as to prevent a malfunction from occurring in the semiconductor element.

Additionally, since the projection amount of the heat-dissipation member from the mount surface is set equal to or smaller than the projection amount of the resin projection including the metal film, the heat-dissipation member does not thwart the joining of the metal film and the mounting substrate upon mounting the semiconductor device.

Additionally, according to the present invention, the heat-dissipation member is a metal plate formed of the lead-frame material so as to obtain an excellent heat-dissipation characteristic because the lead-frame material has a high coefficient of thermal conductivity.

Additionally, according to the present invention, a material having an excellent adhesiveness can be used as the metal layer so as to fix the heat-dissipation member firmly. In addition, since the metal layer per se has a thermal conductivity, the heat generated in the semiconductor element can be efficiently transferred by thermal conduction to the heat-dissipation member.

Additionally, according to the present invention, by providing the heat-dissipation member between the semiconductor element and the backside terminal, a heat-dissipation capacity can be increased so as to perform an efficient heat-dissipation process.

Additionally, according to the present invention, the heat generated in the semiconductor element can be directly dissipated to the heat-dissipation member so as to improve a heat-dissipation efficiency. Also, the heat-dissipation member can be used as a substrate on which the semiconductor element is mounted.

Additionally, according to the present invention, utilizing the lead frame used upon manufacturing the semiconductor device, a part of the lead frame is caused to remain, in the first and second lead frame removing steps, so that the part becomes the heat-dissipation member; therefore, manufacturing steps can be simplified, compared to a method of forming a heat-dissipation member from a material different from the lead frame. In addition, a new manufacturing facility for forming the heat-dissipation member is also unnecessary so that facility costs do not increase.

Further, according to the present invention, a lead-frame cost required for manufacturing one semiconductor device can be reduced, and thus a manufacturing cost can be reduced. In addition, since a multitude of the semiconductor devices can be formed all at one time, a manufacturing efficiency can be improved.

The present invention is not limited to the specifically disclosed embodiments, and variations and modifications are conceivable without departing from the claimed scope of the present invention.

What is claimed is:

1. A semiconductor device comprising:
   a semiconductor element;
   a resin package sealing said semiconductor element;
   a plurality of resin projections formed on a mount side of said resin package so as to protrude thereon;
   a metal film provided on said resin projection;
   a wire electrically connecting an electrode pad on said semiconductor element and said metal film to each other; and
   a heat-dissipation member provided opposite said semiconductor element so as to dissipate heat generated from said semiconductor element,
   wherein a projection amount of said heat-dissipation member from said mount surface is arranged to be equal to or smaller than a projection amount of said resin projection including said metal film.

2. The semiconductor device as claimed in claim 1, wherein said heat-dissipation member is a metal plate formed of a lead-frame material.

3. The semiconductor device as claimed in claim 1 or 2, further comprising at least one metal layer provided between said semiconductor element and said heat-dissipation member, and
wherein said heat-dissipation member is fixed to said metal layer by bonding.

4. A semiconductor device comprising:
a semiconductor element;
a resin package sealing said semiconductor element;
a plurality of resin projections formed in a peripheral form on a mount side of said resin package so as to protrude thereon;
a metal film provided on said resin projection;
a backside terminal formed inside positions on said mount side at which said resin projections are provided so as to protrude thereat;
a wire electrically connecting an electrode pad on said semiconductor element and said metal film to each other; and
a heat-dissipation member provided between said semiconductor element and said backside terminal.

5. The semiconductor device as claimed in claim 4, wherein said semiconductor element is placed on said heat-dissipation member.

6. A manufacturing method of a semiconductor device comprising:
a semiconductor element;
a resin package sealing said semiconductor element;
a plurality of resin projections formed on a mount side of said resin package so as to protrude thereon;
a metal film provided on said resin projection;
a sire electrically connecting an electrode pad on said semiconductor element and said metal film to each other; and
a heat-dissipation member comprising a metal plate formed of a lead-frame material provided opposite and semiconductor element so as to dissipate heat generated from said semiconductor element,
wherein a projection amount of said heat-dissipation member from said mount surface is arranged to be equal to or smaller than a projection amount of said resin projection including said metal film, said method comprising:
a lead frame forming step of forming a lead frame by preparing a substrate formed of the lead-frame material, forming a receding portion at a position in said substrate corresponding to a position at which said resin projection is formed, and coating inside of said receding portion with said metal film;
an element mounting step of mounting said semiconductor element on said lead frame, and electrically connecting said semiconductor element ad said metal film to each other by said wire;
a sealing step of forming said resin package sealing at least said semiconductor element and said wire;
a first lead frame removing step of removing said lead frame so that a thickness of said lead frame becomes equal to or smaller than a height of said resin projection including said metal film from said mount surface; and
a second lead frame removing step of providing a resist material at a predetermined position on said lead frame at which to form said heat-dissipation member, and thereafter, removing said lead frame on which said resist is not provided so as to form said heat-dissipation member.

7. A lead frame used upon manufacturing a semiconductor device comprising:
a semiconductor device;
a resin package sealing said semiconductor device;
a resin projection formed on a mount surface of said resin package so as to protrude thereon;
a metal film provided on said resin projection;
connecting means for electrically connecting an electrode pad on said semiconductor element and said metal film to each other; and
a receding portion formed at a position in a base corresponding to a position at which said resin projection is formed, the receding portion having said metal film formed therein, is formed at opposite surfaces of said base.

8. The lead frame as claimed in claim 7, wherein said metal film is a four-layer structured film of a solder layer, a nickel (Ni) layer, a palladium (Pd) layer, and a gold (Au) layer, from an inner layer, or a four-layer structured film of a palladium (Pd) layer, a nickel (Ni) layer, a palladium (Pd) layer, and a gold (Au) layer, from the inner layer.

9. The lead frame as claimed in claim 7 or 8, wherein said base is composed of first and second half bases at one surface of each of which said receding portion is formed, and surfaces of said first and second half bases at which said receding portion is not formed are joined to each other.

10. A manufacturing method of a lead frame comprising:
a semiconductor device;
a resin package sealing said semiconductor device;
a resin projection formed on a mount surface of said resin package so as to protrude thereon;
a metal film provided on said resin projection;
connecting means for electrically connecting an electrode pad on said semiconductor element and said metal film to each other; and
a receding portion formed at a position in a base corresponding to a position at which said resin projection is formed, the receding portion having said metal film formed therein, is formed at opposite surfaces of said base, said method comprising:
a resist applying step of applying etching resists on both surfaces of the base;
a resist pattern forming step of forming predetermined resist patterns by removing portions of said etching resists corresponding to said receding-portion forming positions;
an etching step of forming the receding portions at said receding-portion forming positions at both surfaces of said base by using the resist patterns as masks;
a metal-film forming step of forming said metal films in the receding portions formed in said etching step; and
a resist removing step of removing said etching resists.

11. A manufacturing method of a semiconductor device by using the lead frame comprising:
a semiconductor device;
a resin package sealing said semiconductor device;
a resin projection formed on a mount surface of said resin package so as to protrude thereon;
a metal film provided on said resin projection;
connecting means for electrically connecting an electrode pad on said semiconductor element and said metal film to each other; and a receding portion formed at a position in a base corresponding to a position at which said resin projection is formed, the receding portion having said metal film formed therein, is formed at opposite surface of said base, wherein said base is composed of first and second half bases at one surface of each of which said receding portion is formed, and surfaces of said first and secondhalf bases at which said receding portion is not formed are joined to each other, said method comprising:

an element mounting step of mounting the semiconductor element on said lead frame;

a connecting step of electrically connecting an electrode pad formed on said semiconductor element and said metal film formed in said lead frame to each other;

a sealing step of forming a resin on said lead frame, the resin sealing said semiconductor device, so as to form the resin package;

a dividing step of dividing said lead frame into said first half base and said second half base; and a separating step of separating said resin package together with said metal film from said first and second half bases.

* * * * *